(12) United States Patent
Zhu (10) Patent No.: US 11,931,992 B2
(45) Date of Patent: Mar. 19, 2024

(54) BACKPLATE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Cuilin Zhu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 347 days.

(21) Appl. No.: 17/261,907

(22) PCT Filed: Oct. 23, 2020

(86) PCT No.: PCT/CN2020/123067
§ 371 (c)(1),
(2) Date: Jan. 21, 2021

(87) PCT Pub. No.: WO2022/062016
PCT Pub. Date: Mar. 31, 2022

(65) Prior Publication Data
US 2022/0396050 A1 Dec. 15, 2022

(30) Foreign Application Priority Data
Sep. 27, 2020 (CN) .......................... 202011031246.7

(51) Int. Cl.
*B32B 3/30* (2006.01)
*B32B 5/14* (2006.01)
(Continued)

(52) U.S. Cl.
CPC .................. *B32B 3/30* (2013.01); *B32B 7/12* (2013.01); *B32B 3/266* (2013.01); *B32B 5/142* (2013.01);
(Continued)

(58) Field of Classification Search
None
See application file for complete search history.

(56) References Cited

U.S. PATENT DOCUMENTS 10,014,352 B1 7/2018 Tsai et al.
10,212,811 B1 * 2/2019 Zhang .................... H10K 59/12
(Continued)

FOREIGN PATENT DOCUMENTS

| CN | 106252378 A | 12/2016 |
|---|---|---|
| CN | 106328599 A | 1/2017 |

(Continued)

OTHER PUBLICATIONS

Machine Translation of CN-206516661-U, Sep. 2017 (Year: 2017).*
(Continued)

*Primary Examiner* — Jeffrey A Vonch
(74) *Attorney, Agent, or Firm* — PV IP PC; Wei Te Chung; Zhigang Ma (57) ABSTRACT

The present invention provides a backplate and a display device. The backplate is adapted for a display device, the display device includes a bending region, and the backplate includes a bonding region configured to bond to the bending region of the display device. The bonding region includes at least one cutout. When the bending region and the bonding region are bent, squeezing stress is applied to the bending region, the at least one cutout contracts inwardly to reduce the squeezing stress applied to the bending region.

16 Claims, 9 Drawing Sheets

(51) Int. Cl.
  *B32B 7/12* (2006.01)
  *G09F 9/30* (2006.01)
  *B32B 3/26* (2006.01)
  *G02F 1/1333* (2006.01)
  *H10K 77/10* (2023.01)

(52) U.S. Cl.
  CPC .......... *B32B 5/147* (2013.01); *B32B 2457/20* (2013.01); *B32B 2457/202* (2013.01); *B32B 2457/206* (2013.01); *B32B 2457/208* (2013.01); *G02F 1/133305* (2013.01); *G02F 1/133308* (2013.01); *G09F 9/301* (2013.01); *H10K 77/111* (2023.02); *Y10T 428/24298* (2015.01); *Y10T 428/24331* (2015.01); *Y10T 428/24479* (2015.01); *Y10T 428/2457* (2015.01); *Y10T 428/24587* (2015.01)

(56) References Cited

U.S. PATENT DOCUMENTS

| | | | | |
|---|---|---|---|---|
| 11,049,423 | B1* | 6/2021 | Wang | G06F 1/1652 |
| 2012/0287057 | A1* | 11/2012 | Wei | C03B 11/082 |
| | | | | 345/173 |
| 2016/0062391 | A1* | 3/2016 | Choi | G06F 1/1652 |
| | | | | 361/679.01 |
| 2017/0045672 | A1* | 2/2017 | Lee | G02F 1/1345 |
| 2017/0054106 | A1* | 2/2017 | Jeon | H10K 77/111 |
| 2017/0294495 | A1* | 10/2017 | Shyu | G06F 3/041 |
| 2018/0047938 | A1* | 2/2018 | Kishimoto | H01L 51/5253 |
| 2018/0088631 | A1* | 3/2018 | Park | H10K 50/844 |
| 2018/0294434 | A1* | 10/2018 | Niu | H10K 50/841 |
| 2019/0058030 | A1* | 2/2019 | Choi | H10K 59/131 |
| 2019/0143631 | A1* | 5/2019 | Zhang | B32B 3/266 |
| | | | | 428/138 |
| 2019/0171057 | A1* | 6/2019 | Kim | H01L 51/0097 |
| 2019/0204872 | A1* | 7/2019 | Lee | G06F 1/1641 |
| 2019/0305232 | A1 | 10/2019 | Chen et al. | |
| 2020/0174519 | A1* | 6/2020 | Huang | G06F 1/166 |
| 2020/0235139 | A1* | 7/2020 | Ke | H01L 21/6835 |
| 2020/0273379 | A1* | 8/2020 | Wang | H10K 77/111 |
| 2021/0118337 | A1* | 4/2021 | Park | G09F 9/301 |
| 2021/0153363 | A1* | 5/2021 | Cao | H05K 5/0017 |
| 2021/0217975 | A1* | 7/2021 | Gu | H10K 77/111 |
| 2021/0335840 | A1* | 10/2021 | Qin | H01L 27/1244 |
| 2021/0352814 | A1* | 11/2021 | Park | G06F 1/1656 |
| 2021/0356993 | A1* | 11/2021 | Chen | G06F 1/1652 |
| 2022/0103670 | A1* | 3/2022 | Liao | G06F 1/1652 |
| 2022/0183148 | A1* | 6/2022 | Wang | G06F 3/0412 |

FOREIGN PATENT DOCUMENTS

| | | | | | |
|---|---|---|---|---|---|
| CN | 107068862 | A | * | 8/2017 | ......... H01L 21/6835 |
| CN | 206516661 | U | * | 9/2017 | ............ G09F 9/301 |
| CN | 108447403 | A | | 8/2018 | |
| CN | 108665804 | A | * | 10/2018 | ............ G09F 9/301 |
| CN | 108682306 | A | * | 10/2018 | ............ G09F 9/301 |
| CN | 108831303 | A | | 11/2018 | |
| CN | 108831303 | A | * | 11/2018 | ............ G09F 9/301 |
| CN | 108932074 | A | | 12/2018 | |
| CN | 109032251 | A | * | 12/2018 | ........... G06F 1/1652 |
| CN | 109087586 | A | * | 12/2018 | ............ G09F 9/301 |
| CN | 109616021 | A | | 4/2019 | |
| CN | 109671718 | A | * | 4/2019 | ............ G09F 9/301 |
| CN | 110047881 | A | * | 7/2019 | |
| CN | 110133917 | A | | 8/2019 | |
| CN | 110165072 | A | * | 8/2019 | ......... H01L 27/3244 |
| CN | 209418505 | U | * | 9/2019 | |
| CN | 110649087 | A | | 1/2020 | |
| CN | 110649087 | A | * | 1/2020 | ............ G09F 9/301 |
| CN | 110827680 | A | | 2/2020 | |
| CN | 110853525 | A | * | 2/2020 | ............ G09F 9/301 |
| CN | 111106150 | A | | 5/2020 | |
| CN | 111383535 | A | * | 7/2020 | .......... G06F 3/0412 |
| JP | 2016018198 | A | | 2/2016 | |
| WO | WO-2020113797 | A1 | * | 6/2020 | ............ G09F 9/301 |
| WO | WO-2021244173 | A1 | * | 12/2021 | ............ G09F 9/301 |

OTHER PUBLICATIONS

Machine Translation of CN-108831303-A, Nov. 2018 (Year: 2018).*
Google Translation of CN-109032251-A, Dec. 2018 (Year: 2018).*
Machine Translation of CN-110649087-A, Jan. 2020 (Year: 2020).*

* cited by examiner

BACKPLATE AND DISPLAY DEVICE

FIELD OF INVENTION

The present invention relates to a field of display technologies, especially relates to a backplate and a display device.

BACKGROUND OF INVENTION

With development of the display technologies, display devices with full screens become more and more popular.

In a display device with a flexible full screen, a side thereof is also configured to display screen images. During manufacture, the display device with the flexible full screen needs to be processed with a U-shaped bonding process. During bonding the side curve surface, squeezing stress applied to the display panel is the greatest so the display panel is easily broken.

Therefore, it is necessary to provide a display device including a side curved surface not easily broken during bonding.

SUMMARY OF INVENTION

An objective of the present invention is to provide a backplate and a display device that can enhance production yield rate of the display device.

An embodiment of the present invention provides a backplate for a display device, the display device comprising a bending region, and the backplate comprising: a bonding region configured to bond to the bending region of the display device, and the bonding region comprising: at least one cutout;

wherein when the bending region and the bonding region are bent, squeezing stress is applied to the bending region receives, and the at least one cutout contracts inwardly to reduce the squeezing stress applied to the bending region; and wherein the at least one cutout is at least one groove and/or through hole, and/or the at least one cutout is manufactured be a stamp-press process.

In an embodiment, a depth of each of the at least one cutout is less or equal to a thickness of the bonding region.

The embodiment of the present invention provides a backplate for a display device, the display device comprising a bending region, and the backplate comprising: a bonding region configured to bond to the bending region of the display device, and the bonding region comprising: at least one cutout;

wherein when the bending region and the bonding region are bent, squeezing stress is applied to the bending region receives, and the at least one cutout contracts inwardly to reduce the squeezing stress applied to the bending region.

the at least one cutout is configured to reduce stress applied to the bonding region when bonding to the bending region.

In an embodiment, the at least one cutout is at least one groove and/or through hole.

In an embodiment, the at least one cutout is manufactured be a stamp-press process.

In an embodiment, a depth of each of the at least one cutout is less or equal to a thickness of the bonding region.

In an embodiment, the at least one cutout is bar-shaped, rectangular, annular, and/or circular.

In an embodiment, when the at least one cutout are at least two, the at least two cutouts are rectangular, each of the at least two cutouts along a bending direction of the bonding region comprises a side edge, an interval is defined between adjacent two of the cutouts, and a ratio of the side edge to the interval is greater than or equal to 0.5, and is less than or equal to 1.5.

In an embodiment, the backplate further comprises a support region, the bonding region further comprises a first region and a second region, the first region is connected to the support region, and the second region is disposed on a side of the first region away from the support region; and when the bonding region comprises a plurality of cutouts, the cutouts are all disposed in the first region, or the cutouts are disposed in the first region and the second region.

In an embodiment, when the cutouts are disposed in the first region and the second region, a distribution density of the cutouts in the first region is greater than a distribution density of the cutouts in the second region.

In an embodiment, when the cutouts are all disposed in the first region, the cutouts in the first region are distributed evenly.

The embodiment of the present invention also provides a display device comprising a backplate and a display panel;

wherein the display panel comprises a bending region;

wherein the backplate comprises a bonding region configured to bond to the bending region, and the bonding region comprising at least one cutout;

wherein when the bending region and the bonding region are bent, squeezing stress is applied to the bending region receives, and the at least one cutout contracts inwardly to reduce the squeezing stress applied to the bending region.

In an embodiment, the at least one cutout is at least one groove and/or through hole.

In an embodiment, the at least one cutout is manufactured be a stamp-press process.

In an embodiment, a depth of each of the at least one cutout is less or equal to a thickness of the bonding region.

In an embodiment, the at least one cutout is bar-shaped, rectangular, annular, and/or circular.

In an embodiment, when the at least one cutout are at least two, the at least two cutouts are rectangular, each of the at least two cutouts along a bending direction of the bonding region comprises a side edge, an interval is defined between adjacent two of the cutouts, and a ratio of the side edge to the interval is greater than or equal to 0.5, and is less than or equal to 1.5.

In an embodiment, the backplate further comprises a support region, the bonding region further comprises a first region and a second region, the first region is connected to the support region, and the second region is disposed on a side of the first region away from the support region; and when the bonding region comprises a plurality of cutouts, the cutouts are all disposed in the first region, or the cutouts are disposed in the first region and the second region.

In an embodiment, when the cutouts are disposed in the first region and the second region, a distribution density of the cutouts in the first region is greater than a distribution density of the cutouts in the second region.

In an embodiment, when the cutouts are all disposed in the first region, the cutouts in the first region are distributed evenly.

The backplate and the display device of the embodiment of the present invention, by disposing at least one cutout in the bonding region of the backplate, can reduce the stress applied to the bonding region when bonding to the bending region of the display device, which enhances the product yield rate of the display device.

DESCRIPTION OF DRAWINGS

Specific embodiments of the present invention are described in details with accompanying drawings as follows to make technical solutions and advantages of the present invention clear.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

The following disclosure provides many different embodiments or examples to achieve different structures of the present invention. To simplify the disclosure of the present invention, the components and arrangements of the specific examples are described below. Of course, they are merely examples, and the purpose is not to limit the present invention. Furthermore, the present invention may repeat reference numerals and/or reference letters in different examples. The repetition is for the purpose of simplification and clarity, and does not by itself indicate the relationship between the various embodiments and/or settings discussed. In addition, the present invention provides examples of various specific processes and materials, but a person of ordinary skill in the art can be aware of the application of other processes and/or the use of other materials.

Figure 1:
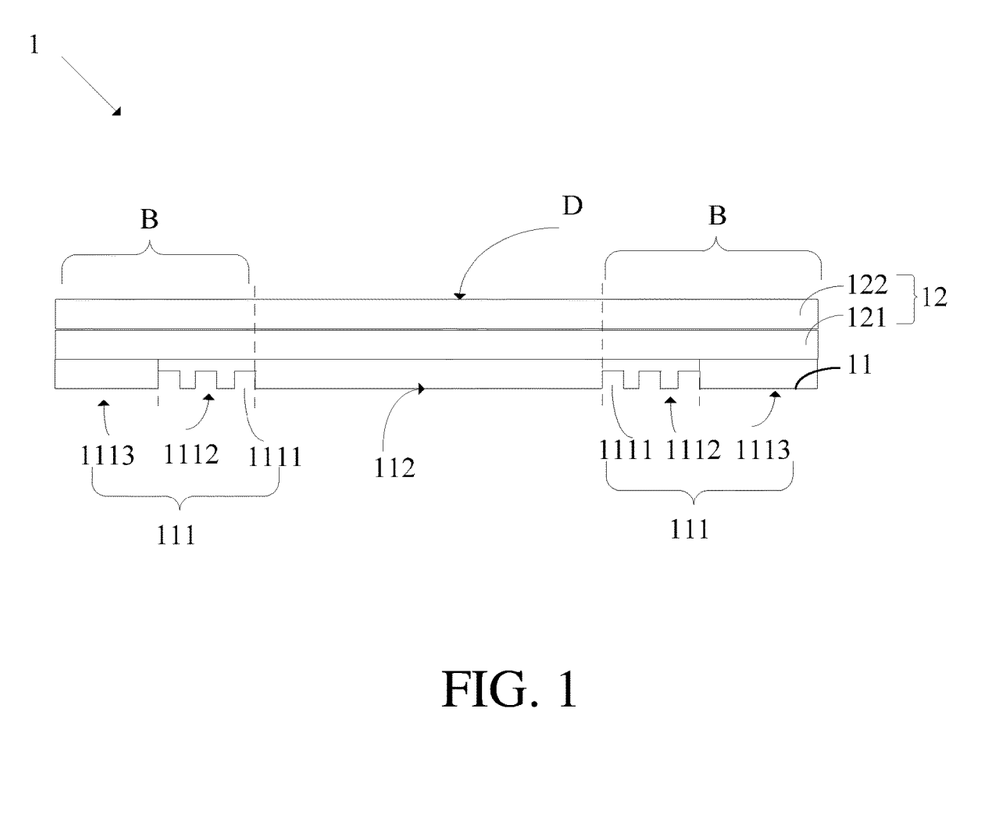
FIG. 1 is a first schematic cross-sectional structural view of a display device provided by an embodiment of the present invention.

The embodiment of the present invention provides a display device, with reference to FIG. 1, FIG. 1 is a first schematic cross-sectional structural view of a display device provided by an embodiment of the present invention. As shown in FIG. 1, the display device 1 comprises a backplate 11 and a display panel 12. The display panel 12 can be a liquid crystal display panel or organic light emitting diode display panel, which is not limited specifically. Specifically, display panel 12 comprises a light emitting device 121 and a polarizer 122. The light emitting device 121 is configured to emit light. The polarizer 122 is configured to polarize light.

The display panel 12 comprises a displaying region D, the displaying region D is configured to display screen images. As shown in FIG. 1, the displaying region D comprises a bending region B. The bending region B is disposed on two sides of the displaying region D. The bending region B is bent along predetermined direction.

The backplate 11 is configured to support the display panel 12 disposed thereon. The backplate 11 comprises a bonding region 111 and a support region 112. The bonding region 111 is connected to the support region 112. When the display device 1 is assembled, the bonding region 111 of the backplate 11 bonds to the bending region B of the display panel 12, and the support region 112 of the backplate 11 bonds to a portion of the displaying region D in the display panel 12 without the bending region B.

With reference to FIG. 1, bonding region 111 comprises at least one cutout 1111. In an embodiment, bonding region 111 further comprises a first region 1112 and a second region 1113. A region of the bonding region 111 connected to the support region 112 is the first region 1112. The second region 1113 is disposed on a side of the first region 1112 away from the support region 112.

When the bending region B and the bonding region 111 are bent together, squeezing stress is applied to the bending region B. A portion of the bending region B corresponding to the first region 1112 receives the greatest squeezing stress. Therefore, when the bonding region 111 comprises a plurality of cutouts 1111, as shown in FIG. 1, the cutouts 1111 can be all disposed in the first region 1112 to reduce the squeezing stress applied to the portion of the bending region B corresponding to the first region 1112. Specifically, the cutouts 1111 can be distributed evenly in the first region 1112.

Figure 2:
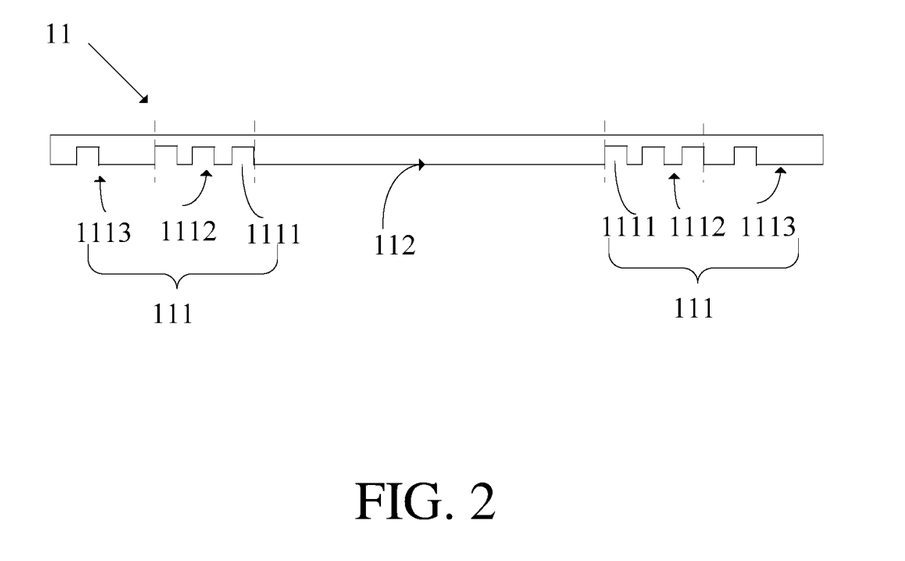
FIG. 2 is a first schematic cross-sectional structural view of the backplate of the embodiment of the present invention.
Figure 3:
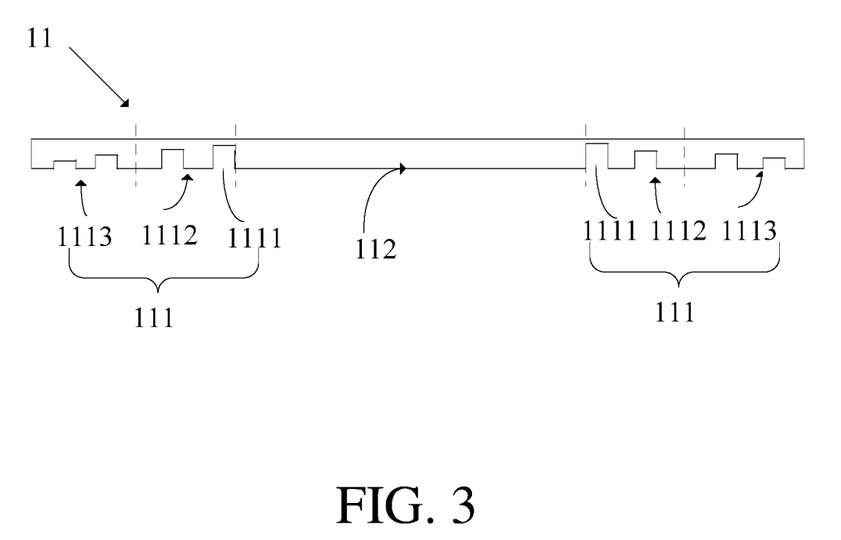
FIG. 3 is a second schematic cross-sectional structural view of the backplate of the embodiment of the present invention.

Furthermore, for ease of the squeezing stress applied to the bending region B, cutouts 1111 can also be disposed in the second region 1113. For example, cutouts 1111 are disposed in a region of the second region 1113 2-4 millimeters near first region 1112. In an embodiment, as shown in FIG. 2, a distribution density of the cutouts 1111 in the first region 1112 can be greater than a distribution density of the cutouts of the second region 1113 such that the cutouts 1111 in the first region 1112 can ease greater squeezing stress. In an embodiment, the distribution density of the cutouts 1111 in the first region 1112 can also be set as to be equal to the distribution density of the cutouts 1111 in the second region 1113, and an average depth of the cutouts 1111 in the first region 1112 is set to be greater than an average depth of the cutouts 1111 in the second region, which also allow the cutouts 1111 in the first region 1112 to ease greater squeezing stress. In particular, as shown in FIG. 3, a depth of the cutout 1111 of the bonding region 111 near the support region 112 can be greater than a depth of the cutout 1111 of the bonding region 111 away from the support region 112.

Figure 4:
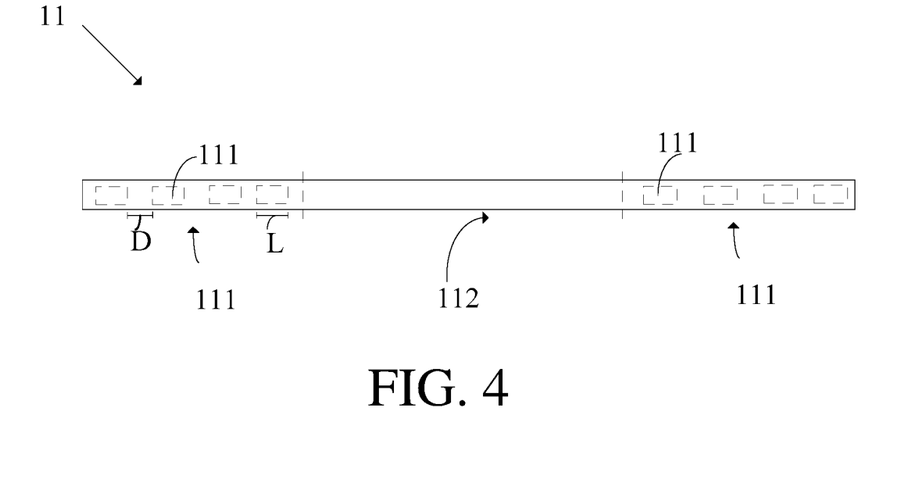
FIG. 4 is a third schematic cross-sectional structural view of the backplate of the embodiment of the present invention.
Figure 5:
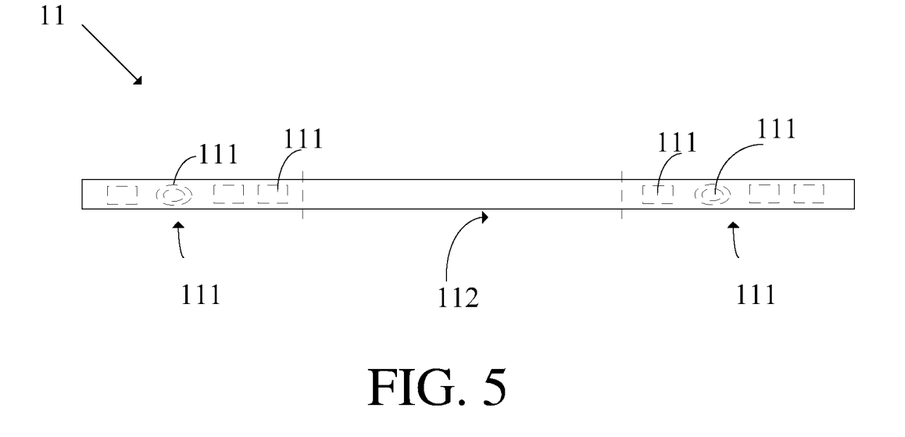
FIG. 5 is a fourth schematic cross-sectional structural view of the backplate of the embodiment of the present invention.

The cutout 1111 can be bar-shaped, rectangular, annular, and/or circular. When the bonding region 111 comprises a plurality of cutouts 1111, shapes of the cutouts 1111 can be the same or different. FIGS. 4 and 5 are top views of the backplate 11. As shown in FIG. 4, the cutouts 1111 in the bonding region 111 are rectangular. As shown in FIG. 5, the cutouts 1111 in the bonding region 111 are rectangular and annular.

With reference to FIG. 4, when the bonding region 111 comprises at least two cutouts 1111, the at least two cutouts are rectangular, each of the at least two cutouts 1111 has a side edge L along a bending direction of the bonding region 111. An interval D is defined between adjacent two of the cutouts 1111. A ratio of the side edge L to the interval D is greater than or equal to 0.5, and is less than or equal to 1.5. by reasonably setting a size and the distribution density of the cutouts 1111, the bonding region 111 can ease greater squeezing stress and have better support capability.

Figure 6:
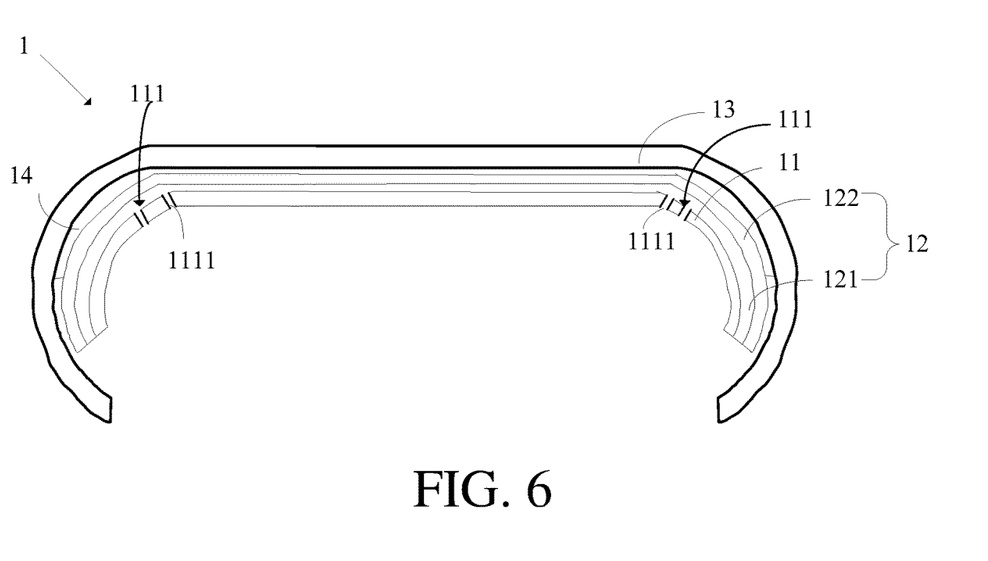
FIG. 6 is a second schematic cross-sectional structural view of the display device provided by the embodiment of the present invention.

In an embodiment, the cutout 1111 can be a groove and/or a through hole. As shown in FIGS. 1 to 3, the cutout 1111 is a groove. As shown in FIG. 6, the cutout 1111 is a through hole. quantities of the grooves and/or through holes in the bonding region 111 are not limited. For example, a thickness of the entire bonding region 111 can be reduced to form groove. Furthermore, a plurality of grooves arranged in an array can be defined in the bonding region 111. A ratio of a total area of the grooves to a total area of the bonding region 111 can be from ¼ to ¾, and is preferably ½. The area ratio can range according to the squeezing stress applied to the bending region B and a hardness thereof, and is not limited herein.

Figure 7:
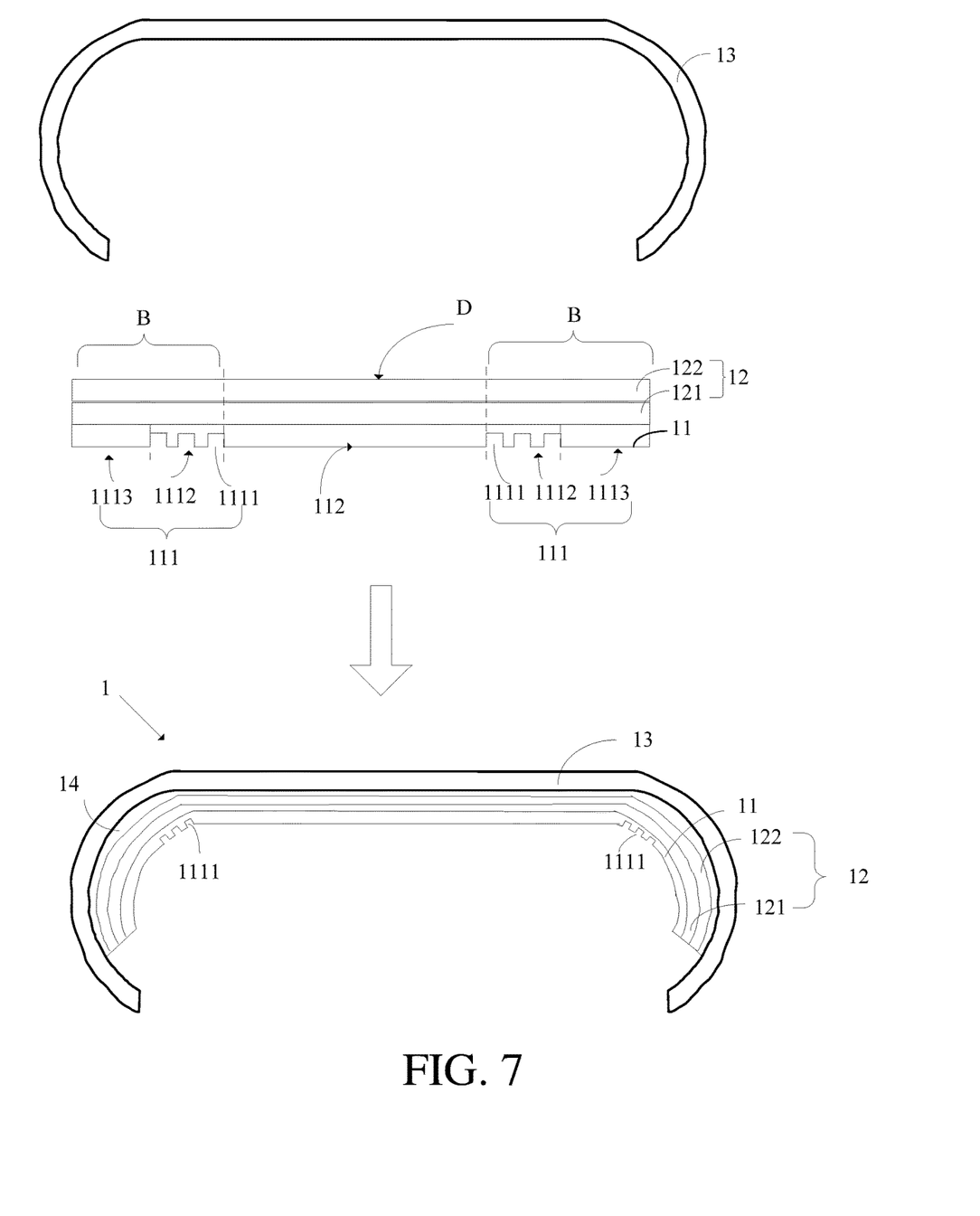
FIG. 7 is a first schematic bonding flowchart of the display device provided by the embodiment of the present invention.

It should be explained that when the cutout 1111 is a groove, as shown in FIG. 7, before the bonding region 111 and bending region B are bent, the groove can be formed in the bonding region 111 and the backplate 11 is bonded to the display panel 12, then finally the cover plate 13 is bonded to the display panel 12. Alternatively, the bonding region 111 is bonded to the bending region B, after the cover plate 13 is bonded to the display panel 12, a groove is formed in the bonding region 111. When the cutout 1111 is a through hole, preferably, after the bonding region 111 is bonded to the bending region B, a through hole is formed in the bonding region 111.

In an embodiment, the cutout 1111 can be manufactured by a stamp-press process. Because the cutout 1111 manufactured by the stamp-press process does not necessarily remove the material in the bonding region 111, manufacturing processes can be simplified.

Figure 8:
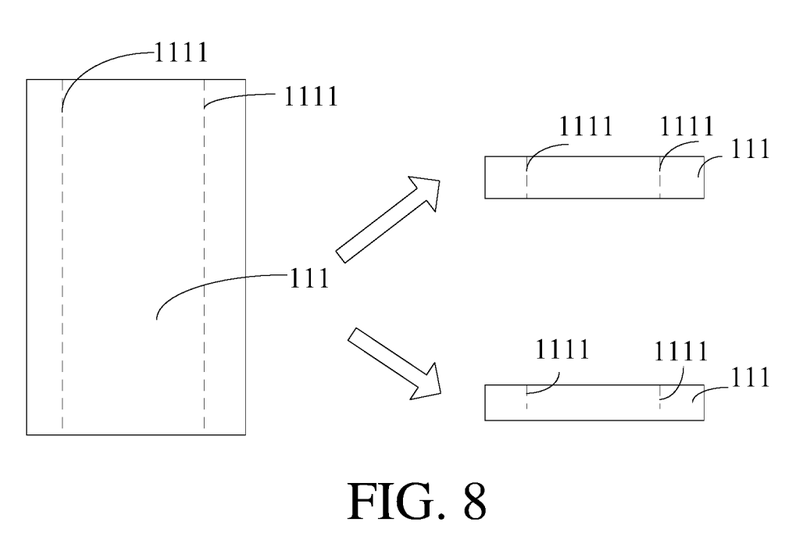
FIG. 8 is a schematic structural view of a cutout provided by the embodiment of the present invention.

With reference to FIG. 8, when the cutout 1111 is manufactured by the stamp-press process, a depth of the cutout 111 can be less than a thickness of the bonding region 111, and can be equal to the thickness of the bonding region 111. Namely, the cutout 1111 can be defined through or defined in the bonding region 111. When the bonding region 111 comprises a plurality of cutouts 1111 時, the depth of each cutout 1111 can be the same or different.

Figure 9:
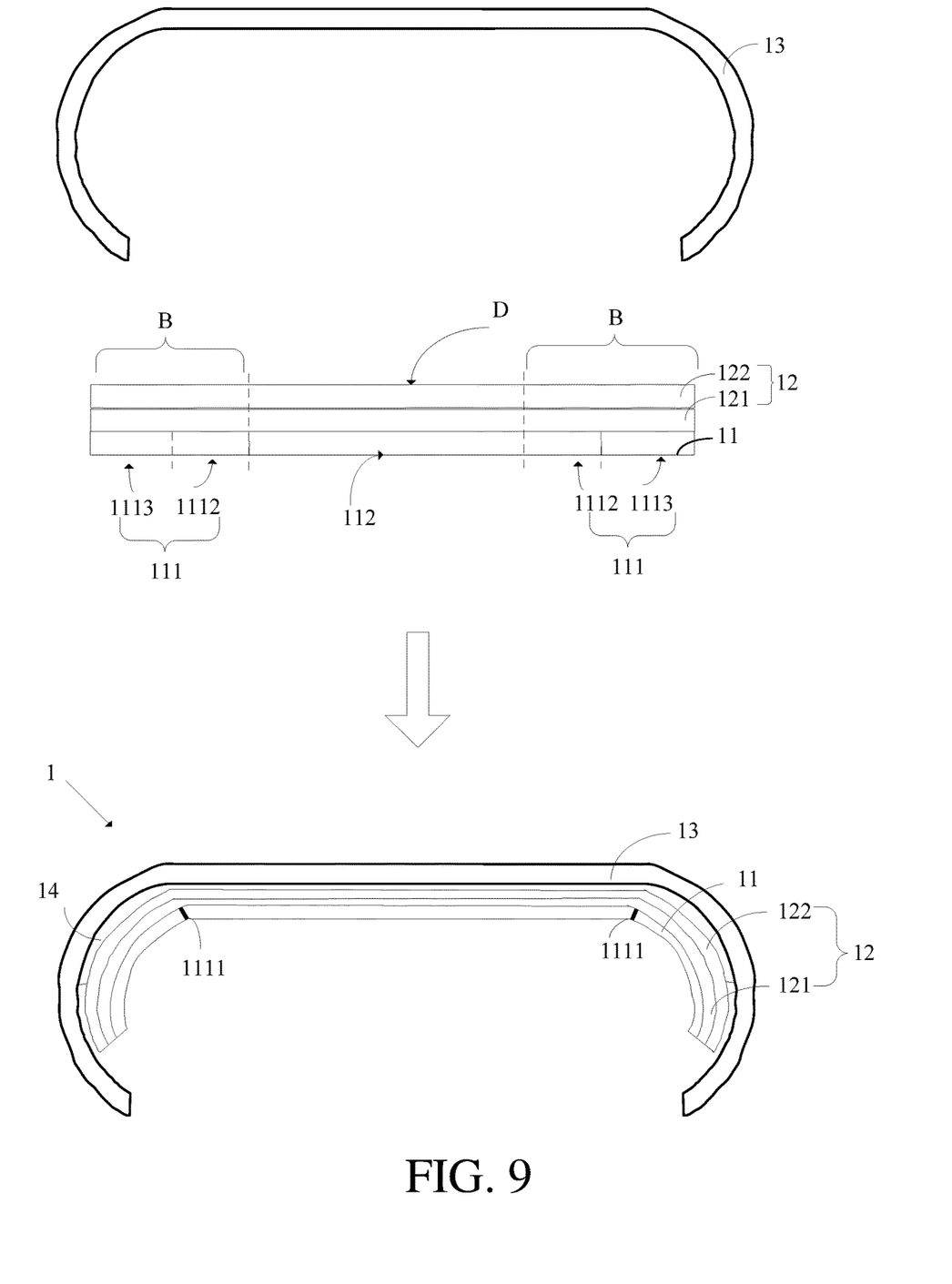
FIG. 9 is a second schematic bonding flowchart of the display device provided by the embodiment of the present invention.

It should be explained that, in an embodiment, before the bonding region 111 and the bending region B are bent, the bonding region 111 is stamp-pressed to form the cutout 1111. In another embodiment, as shown in FIG. 9, the bonding region 111 the bending region B are bent, the cover plate 13 is bonded to the display panel 12, and the bonding region 111 is stamp-pressed to form a cutout 1111.

In an embodiment, a cutout can be disposed in a region of the support region 112 near the bonding region 111 to further ease squeezing stress during bending. For example, a cutout is disposed in a region of the support region 112 1-2 millimeters near the bonding region 111.

The display device 1 further comprises a cover plate 13. The cover plate 13 is disposed on the display panel 12, is configured to protect the display panel 12. Specifically, the cover plate 13 is disposed on the polarizer 122. The cover plate 13 comprises a bending region 131. When the display device 1 is fabricated, the bending region 131 bonds to the bending region B of the display panel 12.

Furthermore, display device 1 further comprises a colloid layer 14. The cover plate 3 is fastened through the colloid layer 14 on the display panel 12. Material of the colloid layer 14 comprises optically clear adhesive (OCA).

The backplate and the display device of the embodiment of the present invention, by disposing at least one cutout in the bonding region of the backplate, can reduce the stress applied to the bonding region when bonding to the bending region of the display device, which enhances the product yield rate of the display device.

In the above-mentioned embodiments, the descriptions of the various embodiments are focused. For the details of the embodiments not described, reference may be made to the related descriptions of the other embodiments.

The backplate and the display device provided by the embodiment of the present invention are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A backplate for a display device, the display device comprising a bending region, and the backplate comprising: a supporting region, a bonding region disposed adjacent to the supporting region and configured to bond to the bending region of the display device, and the bonding region comprising: cutouts that are grooves;
   wherein when the bending region and the bonding region are bent, squeezing stress is applied to the bending region receives, and the cutouts contract inwardly to reduce the squeezing stress applied to the bending region;
   wherein a depth of one of the cutouts of the bonding region near the support region is greater than a depth of another of the cutouts of the bonding region away from the support region;

wherein the cutouts are divided into two cutout sets arranged symmetrically relative to the support region, each of the cutout sets has some of the cutouts, and the depths of the cutouts in each of the cutout sets gradually decrease from a side of the cutout set adjacent to the support region to another side of the cutout set away from the support region.

2. The backplate as claimed in claim 1, wherein the cutouts are manufactured by a stamp-press process.

3. The backplate as claimed in claim 2, wherein the depth of each of the cutouts is less or equal to a thickness of the bonding region.

4. The backplate as claimed in claim 1, wherein the cutouts are bar-shaped, rectangular, annular, and/or circular.

5. The backplate as claimed in claim 4, wherein the cutouts are rectangular, each of the cutouts along a bending direction of the bonding region comprises a side edge, an interval is defined between adjacent two of the cutouts, and a ratio of the side edge to the interval is greater than or equal to 0.5, and is less than or equal to 1.5.

6. The backplate as claimed in claim 1, wherein
the bonding region further comprises a first region and a second region, the first region is connected to the support region, and the second region is disposed on a side of the first region away from the support region; and
the cutouts are all disposed in the first region, or the cutouts are disposed in the first region and the second region.

7. The backplate as claimed in claim 6, wherein when the cutouts are disposed in the first region and the second region, a distribution density of the cutouts in the first region is greater than a distribution density of the cutouts in the second region.

8. The backplate as claimed in claim 6, wherein when the cutouts are all disposed in the first region, the cutouts in the first region are distributed evenly.

9. A display device, comprising a backplate and a display panel;
wherein the display panel comprises a bending region;
wherein the backplate comprises a supporting region, a bonding region disposed adjacent to the supporting region and configured to bond to the bending region, and the bonding region comprising cutouts that are grooves;
wherein when the bending region and the bonding region are bent, squeezing stress is applied to the bending region receives, and the cutouts contract inwardly to reduce the squeezing stress applied to the bending region;
wherein a depth of one of the cutouts of the bonding region near the support region is greater than a depth of another of the cutouts of the bonding region away from the support region;
wherein the cutouts are divided into two cutout sets arranged symmetrically relative to the support region, each of the cutout sets has some of the cutouts, and the depths of the cutouts in each of the cutout sets gradually decrease from a side of the cutout set adjacent to the support region to another side of the cutout set away from the support region.

10. The display device as claimed in claim 9, wherein the cutouts are manufactured by a stamp-press process.

11. The display device as claimed in claim 10, wherein the depth of each of the cutouts is less or equal to a thickness of the bonding region.

12. The display device as claimed in claim 9, wherein the cutouts are bar-shaped, rectangular, annular, and/or circular.

13. The display device as claimed in claim 12, wherein the cutouts are rectangular, each of the at least two cutouts along a bending direction of the bonding region comprises a side edge, an interval is defined between adjacent two of the cutouts, and a ratio of the side edge to the interval is greater than or equal to 0.5, and is less than or equal to 1.5.

14. The display device as claimed in claim 9, wherein
the backplate further comprises a support region, the bonding region further comprises a first region and a second region, the first region is connected to the support region, and the second region is disposed on a side of the first region away from the support region; and
the cutouts are all disposed in the first region, or the cutouts are disposed in the first region and the second region.

15. The display device as claimed in claim 14, wherein when the cutouts are disposed in the first region and the second region, a distribution density of the cutouts in the first region is greater than a distribution density of the cutouts in the second region.

16. The display device as claimed in claim 14, wherein when the cutouts are all disposed in the first region, the cutouts in the first region are distributed evenly.

* * * * *